United States Patent
Wu

(10) Patent No.: US 6,992,353 B1
(45) Date of Patent: Jan. 31, 2006

(54) SELF-ALIGNED SOURCE STRUCTURE OF PLANAR DMOS POWER TRANSISTOR AND ITS MANUFACTURING METHODS

(75) Inventor: Ching-Yuan Wu, Hsinchu (TW)

(73) Assignee: Silicon-Based Technology Corp., Hsinchu (TW)

( * ) Notice: Subject to any disclaimer, the term of this patent is extended or adjusted under 35 U.S.C. 154(b) by 0 days.

(21) Appl. No.: 10/976,886

(22) Filed: Nov. 1, 2004

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/335; 257/336; 257/337; 257/338; 257/341

(58) Field of Classification Search .......... 257/328, 257/334–338, 341
See application file for complete search history.

(56) References Cited

U.S. PATENT DOCUMENTS 5,973,361 A * 10/1999 Hshieh et al. ........... 257/341

* cited by examiner

*Primary Examiner*—Thien F. Tran
(74) *Attorney, Agent, or Firm*—Dennison, Schultz, Dougherty & MacDonald

(57) ABSTRACT

A self-aligned source structure is disclosed by the present invention, in which a p-body diffusion region is formed in an n⁻ epitaxial silicon layer on an n⁺ silicon substrate through a patterned window; a p⁺ diffusion region is formed within the p-body diffusion region through a first self-aligned implantation window surrounded by a first sidewall dielectric spacer being formed over and on a silicon nitride layer; an n⁺ source diffusion ring is formed in a surface portion of the p-body diffusion region and on an extended portion of the p⁺ diffusion region through a second self-aligned implantation window formed between the silicon nitride layer and a masking layer surrounded by the first sidewall dielectric spacer; and a self-aligned source contact window is formed on the n⁺ source diffusion ring surrounded by a second sidewall dielectric spacer and on the p⁺ diffusion region surrounded by the n⁺ source diffusion ring.

20 Claims, 6 Drawing Sheets

SELF-ALIGNED SOURCE STRUCTURE OF PLANAR DMOS POWER TRANSISTOR AND ITS MANUFACTURING METHODS

BACKGROUND OF THE INVENTION

1. Field of the Invention

The present invention relates generally to a planar DMOS power transistor and its manufacturing method and, more particularly, to a self-aligned source structure of a planar DMOS power transistor and its manufacturing methods.

2. Description of the Prior Art

A DMOS power transistor with very low on-resistance has become an important device for applications in battery protection, switching, linear regulator, amplifier and power management. It is known that device ruggedness becomes a major reliability issue of the DMOS power transistor and the device ruggedness due to parasitic bipolar transistors formed between source, body and drain becomes a major concern. The parasitic bipolar transistors can be activated to cause a snap back effect which can result in permanent damages to the DMOS power transistor. Several methods had been proposed to improve the parasitic resistances of the parasitic bipolar transistors, however additional critical masking photoresist steps are in general required.

FIG. 1A shows a schematic cross-sectional view for a source structure of a prior art planar DMOS power transistor as disclosed in U.S. Pat. No. 5,268,586 by Mukherjee et al., in which a p-body diffusion region 50 is formed in an $n^-$ epitaxial silicon layer 40 on an $n^+$ silicon substrate 30 through a first implantation window (not shown) surrounded by a patterned polycrystalline-silicon gate layer 80 on a gate oxide layer 70 using a first masking photoresist step; a heavily-doped $n^+$ diffusion ring 60 is formed in a surface portion of the p-body diffusion region 50 through a second implantation window (not shown) formed between a patterned second masking photoresist layer (not shown) being formed on a central portion of the p-body diffusion region 50 and the patterned polycrystalline-silicon gate layer 80 on the gate oxide layer 70; a $p^+$ diffusion region 140 is formed within the p-body diffusion region 50 by a high-energy ion implantation through the first implantation window surrounded by the patterned polycrystalline-silicon gate layer 80 on the gate oxide layer 70; a source contact window is formed by an opening through a silicon oxide layer 90 using a third masking photoresist step; and a contact metal layer 110 is formed on a portion of the heavily-doped $n^+$ diffusion ring 60 and the $p^+$ diffusion region 140 surrounded by the heavily-doped $n^+$ diffusion ring 60.

Apparently, three masking photoresist steps are required to form the source structure shown in FIG. 1A, in which two critical masking photoresist steps (second and third masking photoresist steps) are required and non-uniform current distribution due to non-uniform $n^+$ contact width and parasitic $n^+$ diffusion ring resistance are inevitable. Moreover, it is clearly seen that the $p^+$ diffusion region 140 formed by the high-energy ion implantation must have a peak doping concentration smaller than a tail doping concentration in the heavily-doped $n^+$ diffusion ring 60 without increase the parasitic $n^+$ diffusion ring resistance and contact resistance of the contact metal layer 110 on the $p^+$ diffusion region 140 becomes larger due to a lower surface doping concentration of the $p^+$ diffusion region 140. In addition, a poor metal step coverage or a larger parasitic capacitance between the contact metal layer 110 and the patterned polycrystalline-silicon gate layer 80 can be obtained.

FIG. 1B shows a schematic cross-sectional view for a source structure of another prior art planar DMOS power transistor as disclosed in U.S. Pat. No. 5,930,630 by Hshieh et al., in which a p-body diffusion region 130 is formed in an $n^-$ epitaxial silicon layer 110 on an $n^+$ silicon substrate 105 through a first implantation window (not shown) surrounded by a patterned polycrystalline-silicon gate layer 125 on a gate oxide layer 120 using a first masking photoresist step; Similarly, a heavily-doped $n^+$ diffusion ring 140 is formed through a second implantation window formed between a patterned second masking photoresist layer (not shown) being formed on a central portion of the p-body diffusion region 130 and the patterned polycrystalline-silicon gate layer 125 on the gate oxide layer 120 by using a second masking photoresist step; a third implantation window is formed through a BP-glass layer 145 over a P-glass layer 148 on the gate oxide layer 120 by using a third masking photoresist step; a high-energy and a low-energy implantations are performed in sequence to form a deep $p^+$ diffusion region 165 and a shallow $p^+$ diffusion region 160; a shallow trench is performed on an exposed heavily-doped $n^+$ diffusion ring 140 and the shallow $p^+$ diffusion region 160 through the third implantation window; and a contact metal layer 170 is formed on the shallow trench and over a reflow BP-glass layer 145 over the P-glass layer 148 on the gate oxide layer 120.

Apparently, three masking photoresist steps are required to form FIG. 1B, in which two critical masking photoresist steps (second and third masking photoresist steps) are also required, as those described in FIG. 1A. It is clearly seen that the shallow trench used to reveal the peak doping concentration portion of the shallow $p^+$ diffusion region 160 may simultaneously remove the peak doping concentration portion of the heavily-doped $n^+$ diffusion ring 140, resulting in an increase of the parasitic n+ diffusion ring resistance and the contact resistance between the contact metal layer 170 and the trenched $n^+$ diffusion ring 140. It should be emphasized that the doping concentration of the shallow $p^+$ diffusion region 160 in FIG. 1B must keep to be smaller than the doping concentration in the heavily-doped $n^+$ diffusion ring 140, therefore the shallow trench doesn't improve an overall contact resistance of the heavily-doped $n^+$ source diffusion ring 140 and the p-body diffusion region 130.

From FIG. 1A and FIG. 1B, it is clearly seen that three masking photoresist steps are required to form the source structure, in which two critical masking photoresist steps may produce non-uniform heavily-doped $n^+$ diffusion ring and non-uniform contact width between the heavily-doped $n^+$ diffusion ring and the contact metal layer and the contact resistance between the $p^+$ diffusion region and the contact metal layer is higher due to a lower surface doping concentration in the $p^+$ diffusion region. Apparently, non-uniform current flow may occur for either DMOS power transistor cell or parasitic npn and pnp bipolar transistors due to misalignments of the critical masking photoresist steps, especially as source area of a DMOS power transistor cell is reduced. Moreover, an additional high-energy implantation is required and the cost of production is increased.

It is therefore a major objective of the present invention to offer a fully self-aligned source structure for a planar DMOS power transistor in order to eliminate all detrimental effects due to misalignments of the critical masking photoresist steps.

It is another objective of the present invention to offer a fully self-aligned source structure being fabricated by using only one masking photoresist step.

It is a further objective of the present invention to offer a scalable self-aligned source structure with a minimized cell size.

SUMMARY OF THE INVENTION

The present invention discloses a self-aligned source structure of a planar n-DMOS power transistor and its manufacturing methods. The self-aligned source structure comprises a p-body diffusion region being formed in an n⁻ epitaxial silicon layer on an n+silicon substrate through a patterned window surrounded by a patterned oxide layer on a patterned polycrystalline-silicon gate layer and on a gate oxide layer, wherein the patterned oxide layer on the patterned polycrystalline-silicon layer is patterned by a masking photoresist step; a $p^+$ diffusion region being formed within the p-body diffusion region through a first self-aligned implantation window surrounded by a first sidewall dielectric spacer, wherein the first sidewall dielectric spacer is formed over a sidewall of a silicon nitride layer and on a side portion of the silicon nitride layer and the silicon nitride layer is formed over the patterned oxide layer on the patterned polycrystalline-silicon gate layer surrounded by the patterned polycrystalline-silicon gate layer; an $n^+$ source diffusion ring being formed in a surface portion of the p-body diffusion region and on a portion of the $p^+$ diffusion region through a second self-aligned implantation window between a sidewall portion of the silicon nitride layer and a masking layer being formed on the silicon nitride layer surrounded by the first sidewall dielectric spacer; a self-aligned source contact window being formed by the $n^+$ source diffusion ring surrounded by a second sidewall dielectric spacer and the $p^+$ diffusion region surrounded by the $n^+$ source diffusion ring, wherein the second sidewall dielectric spacer is formed over a sidewall formed by the patterned oxide layer on the patterned polycrystalline-silicon gate layer and on a side portion of the gate oxide layer for forming a first-type self-aligned source contact structure or the second sidewall dielectric spacer is formed over a sidewall of the silicon nitride layer and on a side portion of the silicon nitride layer for forming a second-type self-aligned source contact structure; and a metal layer being at least formed over the self-aligned source contact window, the second sidewall dielectric spacer and the patterned oxide layer, wherein the contact metal layer may comprise a metal silicide layer being formed over the self-aligned source contact window by using a self-aligned silicidation process and a metal layer over a barrier metal layer being at least formed over the metal silicide layer, the second sidewall dielectric spacer and the patterned oxide layer. The self-aligned source structure as described above is fabricated by using only one masking photoresist step. Similarly, a self-aligned source structure of a planar p-DMOS power transistor and its manufacturing methods can be obtained by changing the doping types formed in the semiconductor substrate. Moreover, the self-aligned source structure of the present invention can be applied to fabricate an insulated-gate bipolar transistor (IGBT) or a MOS-controlled Thyristor (MCT).

BRIEF DESCRIPTION OF THE DRAWINGS

FIG. 1A and FIG. 1B show schematic cross-sectional views of prior art planar DMOS power transistors, in which FIG. 1A shows a schematic cross-sectional view of a prior art planar DMOS power transistor and FIG. 1B shows a schematic cross-sectional view of another prior art planar DMOS power transistor.

DETAILED DESCRIPTION OF THE PREFERRED EMBODIMENTS

Referring now to FIG. 2A through FIG. 2H, there are shown process steps and their cross-sectional views of fabricating a first-type self-aligned source structure of a planar n-DMOS power transistor of the present invention.

Figure 1A:
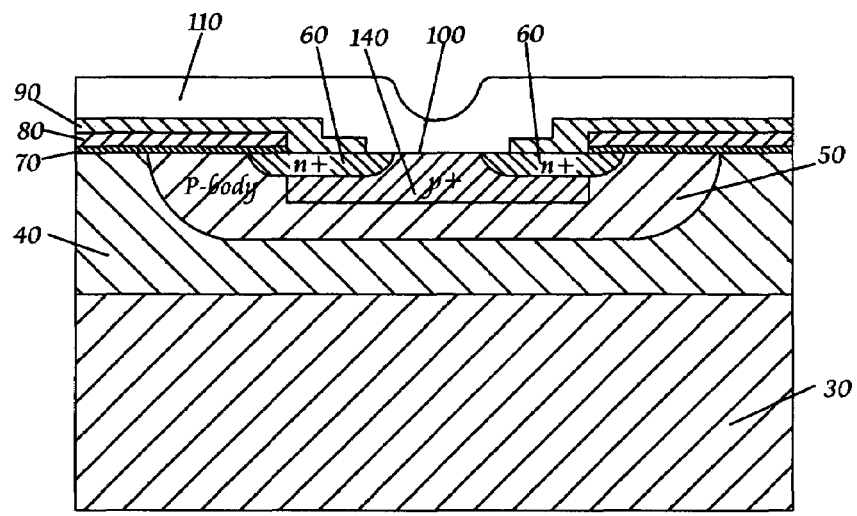
Figure 1B:
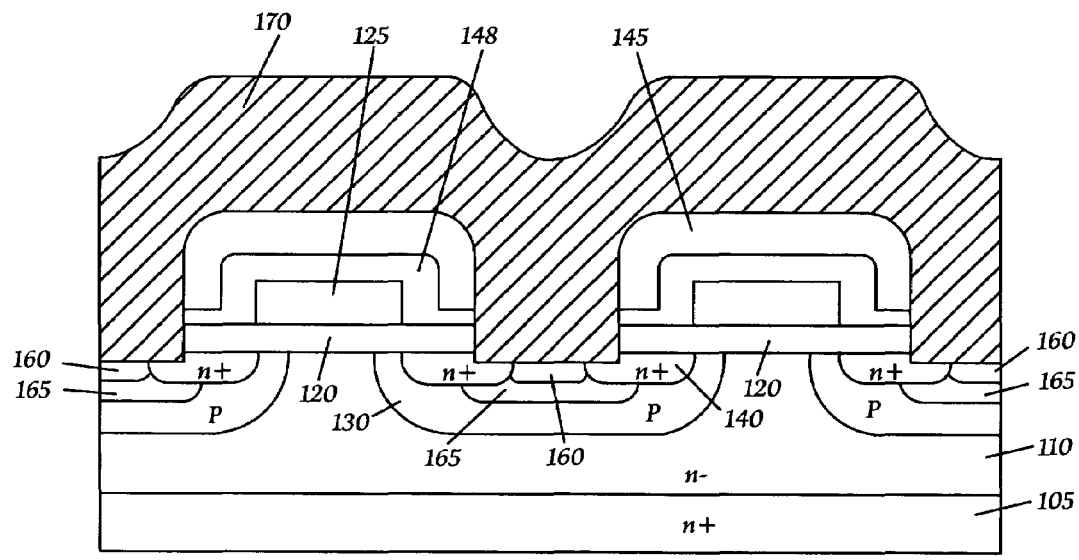
Figure 2A:
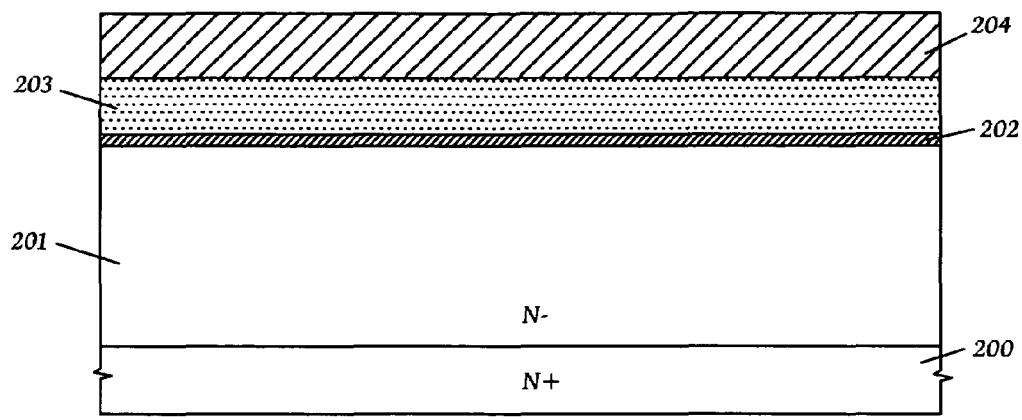
FIG. 2A through FIG. 2H show process steps and their schematic cross-sectional views of fabricating a first-type self-aligned source structure of a planar DMOS power transistor of the present invention.

FIG. 2A shows that a gate dielectric layer 202 is formed over an n⁻ epitaxial silicon layer 201 on an $n^+$ silicon substrate 200; a polycrystalline-silicon gate layer 203 is then formed on the gate dielectric layer 202; and subsequently, a capping dielectric layer 204 is formed on the polycrystalline-silicon gate layer 203. The gate dielectric layer 202 is preferably a thermal silicon dioxide layer or a nitrided thermal silicon dioxide layer and its thickness is preferably between 200 Angstroms and 1000 Angstroms. The n⁻ epitaxial silicon layer 201 has a doping concentration between $10^{14}/cm^3$ and $5\times10^{17}/cm^3$ and a thickness between 2 $\mu$m and 35 $\mu$m. The $n^+$ silicon substrate 200 has a doping concentration between $5\times10^{18}/cm^3$ and $5\times10^{20}/cm^3$ and a thickness between 250 $\mu$m and 800 $\mu$m, depending on wafer size. The polycrystalline-silicon gate layer 203 is preferably deposited by low-pressure chemical vapor deposition (LPCVD) and is heavily-doped with a doping concentration between $5\times10^{18}/cm^3$ and $5\times10^{20}/cm^3$ through in-situ or thermal diffusion process and its thickness is preferably between 2500 Angstroms and 6000 Angstroms. The capping dielectric layer 204 is preferably made of silicon dioxide, phosphosilicate glass (P-glass) or borophosphosilicate glass (BP-glass) as deposited by chemical vapor deposition (CVD) or high-density plasma (HDP)CVD and its thickness is preferably between 4000 Angstroms and 8000 Angstroms.

Figure 2B:
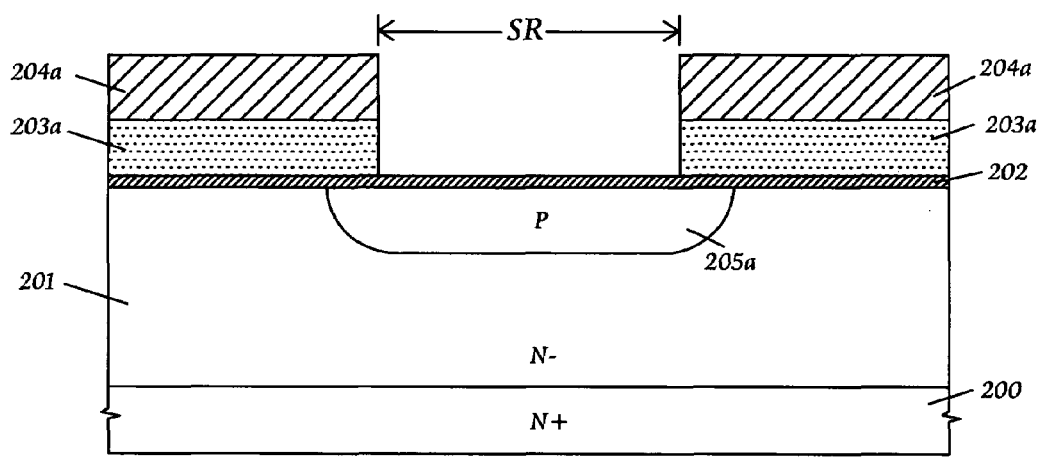

FIG. 2B shows that a masking photoresist step (not shown) is performed to define a plurality of source regions (SR); the capping dielectric layer 204 and the polycrystalline-silicon gate layer 203 in the plurality of source regions (SR) are removed in sequence by using anisotropic dry etching to form a patterned oxide layer 204a on a patterned polycrystalline-silicon gate layer 203a; and subsequently, ion implantation is performed in a self-aligned manner by implanting a moderate dose of boron doping impurities across the gate dielectric layer 202 through a patterned window in each of the plurality of source regions (SR) into a surface portion of the n⁻ epitaxial silicon layer 201 and a drive-in process is then performed to form a p-body diffusion region 205a in each of the plurality of source regions (SR). It should be emphasized that the P-body diffusion region 205a can be formed by a conventional thermal diffusion process by removing the gate dielectric layer 202 in each of the plurality of source regions (SR) before stripping the patterned masking photoresist; a thermal oxide layer (not shown) can be grown over the P-body diffusion region 205a in each of the plurality of source regions (SR) after the conventional diffusion process and a thin polyoxide layer (not shown) is simultaneously formed over a sidewall of the patterned polycrystalline-silicon gate layer 203a. It should be noted that FIG. 2B shows a cross-sectional view for only one of the plurality of source regions (SR) and each of the plurality of source regions (SR) can be patterned to be but not limited to rectangular, square, hexagonal, round or elliptical, and so forth. It should be noted that the moderate dose means the dose of ion implantation between $5\times10^{13}/cm^2$ and $5\times10^{14}/cm^2$.

Figure 2C:
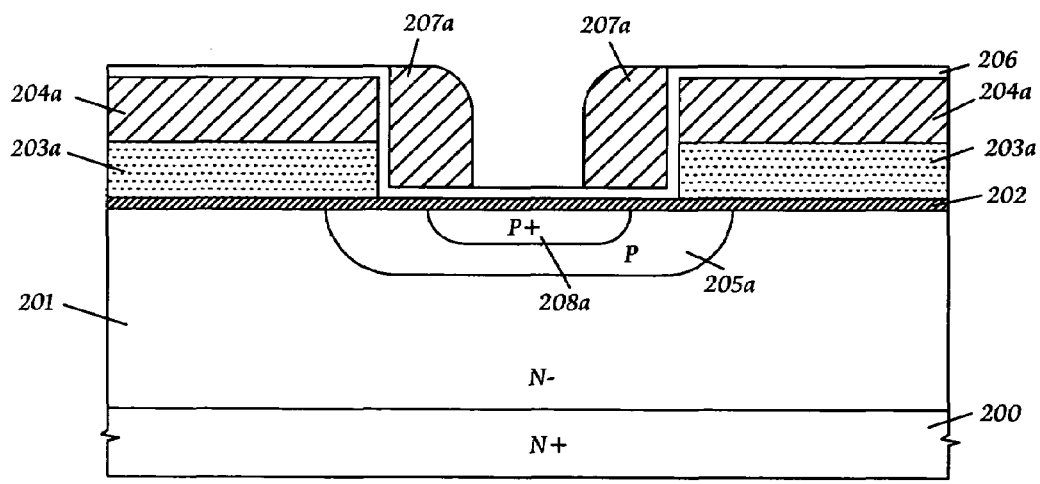

FIG. 2C shows that a dielectric layer 206 is formed over a formed structure surface including the patterned oxide layer 204a on the patterned polycrystalline-silicon gate layer 203a and the gate dielectric layer 202 in each of the plurality of source regions (SR); a first sidewall dielectric spacer 207a is then formed over a sidewall of the dielectric layer 206 and on a side portion of the dielectric layer 206 in each of the plurality of source regions (SR); and a shallow ion implantation is then performed in a self-aligned manner to implant a high dose of boron doping impurities across the dielectric layer 206 on the gate dielectric layer 202 through a first self-aligned implantation window being surrounded by the first sidewall dielectric spacer 207a into a surface portion of the p-body diffusion region 205a; and subsequently, a drive-in process is performed to form a $p^+$ diffusion region 208a within each of the p-body diffusion regions 205a. The dielectric layer 206 is preferably a silicon nitride layer as deposited by LPCVD and its thickness is preferably between 50 Angstroms and 300 Angstroms. The first sidewall dielectric spacer 207a is preferably made of silicon dioxide as deposited by LPCVD and is formed by first depositing a silicon dioxide layer 207 (not shown) over a formed structure surface and then etching back a thickness of the deposited silicon dioxide layer 207. It should be noted that the high dose of boron doping impurities means the dose of ion implantation larger than $10^{15}/cm^2$.

Figure 2D:
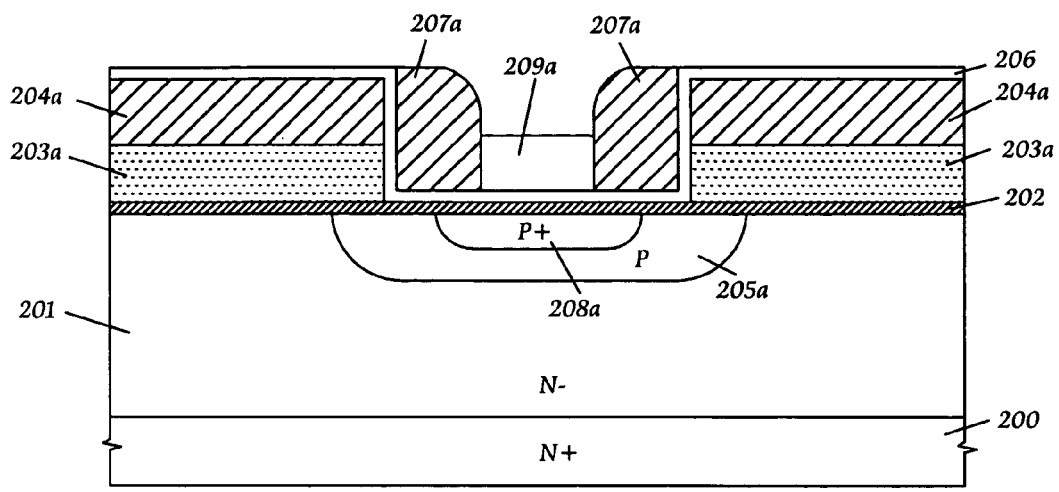

FIG. 2D shows that a masking layer 209a is formed on the silicon nitride layer 206 surrounded by the first sidewall dielectric spacer 207a in each of the plurality of source regions (SR). The masking layer 209a is formed by spinning on a photoresist film 209 (not shown) over the wafer and then etching back the photoresist film 209 to a predetermined thickness. It should be noted that the photoresist layer 209a can be replaced by a polyimide layer, other organic polymer layer or a polycrystalline-silicon layer.

Figure 2E:
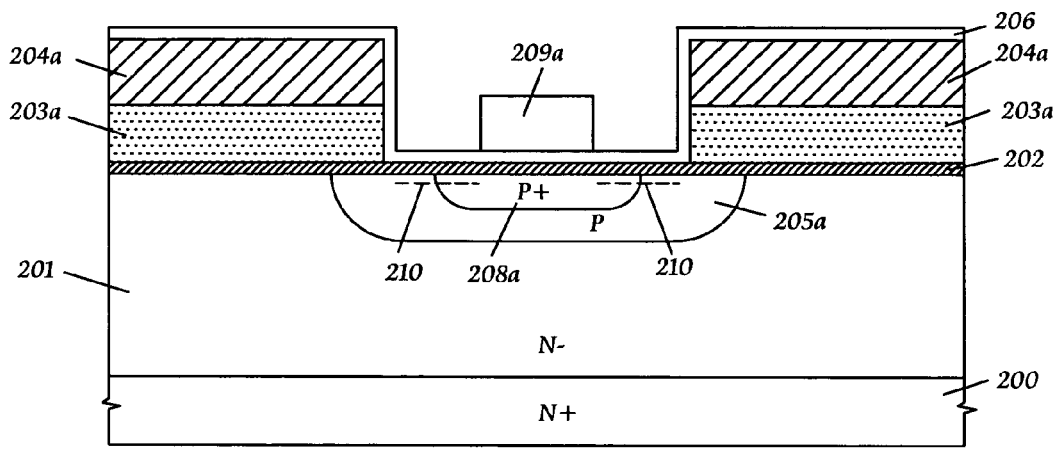

FIG. 2E shows that the first sidewall dielectric spacer 207a in each of the plurality of source regions (SR) is removed by buffered hydrofluoric acid to form a second self-aligned implantation window; and ion implantation is then performed in a self-aligned manner by implanting a high dose of phosphorous or arsenic doping impurities across the silicon nitride layer 206 on the gate oxide layer 202 into a surface portion of the p-body diffusion region 205a through the second self-aligned implantation window being formed between the silicon nitride layer 206 and the masking layer 209a to form an implanted region 210. It is also noted that the high dose of phosphorous or arsenic doping impurities means the dose of ion implantation larger than $10^{15}/cm^2$.

Figure 2F:
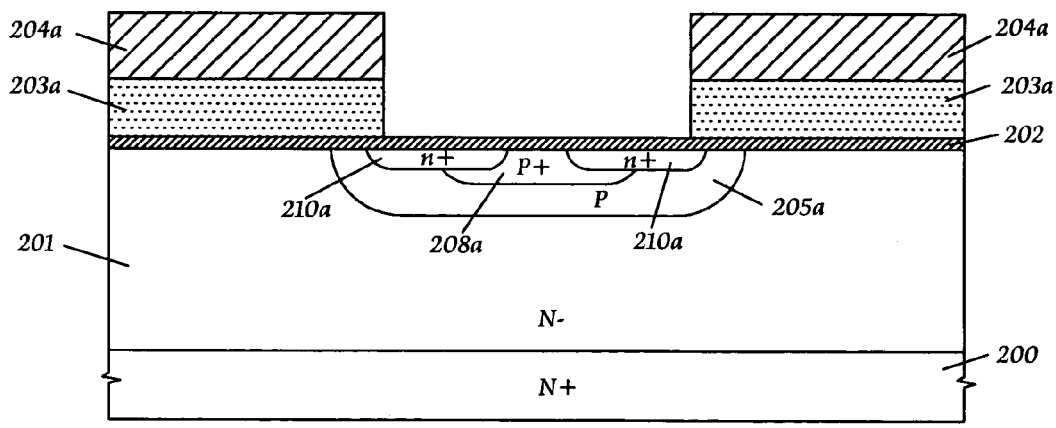

FIG. 2F shows that the masking layer 209a in each of the plurality of source regions (SR) is removed by wet chemicals or plasma ashing; a drive-in process is then performed to form an $n^+$ source diffusion ring 210a in each of the plurality of source regions (SR); and subsequently, the silicon nitride layer 206 is removed by hot-phosphoric acid. It should be noted that the drive-in process can be performed after removing the silicon nitride layer 206.

Figure 2G:
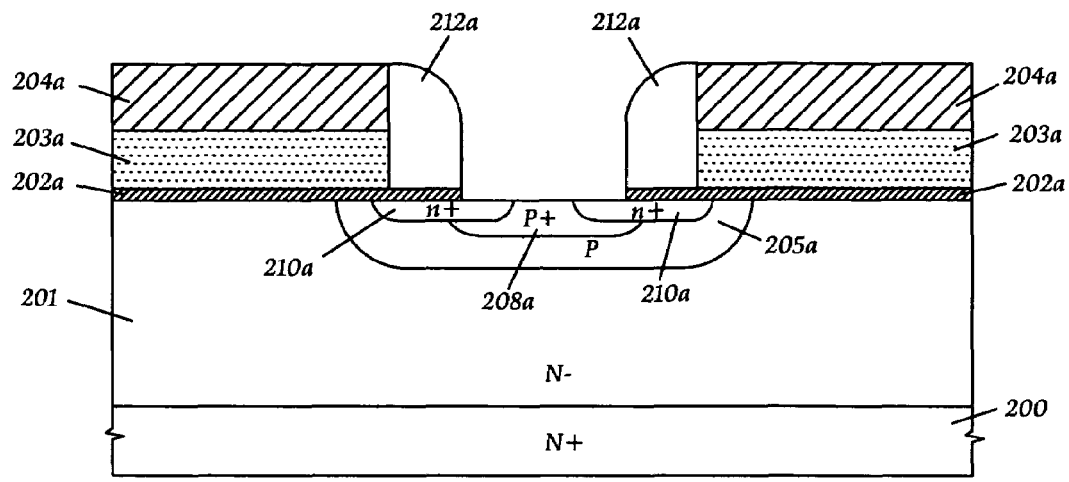

FIG. 2G shows that a second sidewall dielectric spacer 212a is formed over a sidewall of the patterned oxide layer 204a on the patterned polycrystalline-silicon gate layer 203a and on a side portion of the gate oxide layer 202 in each of the plurality of source regions (SR); and subsequently, the gate oxide layer 202 surrounded by the second sidewall dielectric spacer 212a in each of the plurality of source regions (SR) is removed by buffered hydrofluoric acid or anisotropic dry etching to form a self-aligned source contact window. The second sidewall dielectric spacer 212a is preferably made of silicon nitride as deposited by LPCVD and is formed by first depositing a silicon nitride layer 212 (not shown) over a formed structure surface and then etching back a thickness of the deposited silicon nitride layer 212. It should be noted that the second sidewall dielectric spacer 212a can be made of silicon dioxide as deposited by LPCVD or doped oxide as deposited by LPCVD or HDPCVD. It should be emphasized that a thermal oxidation process can be performed to form a thin polyoxide layer (not shown) over a sidewall of the patterned polycrystalline-silicon gate layer 203a before forming the second sidewall dielectric spacer 212a.

Figure 2H:
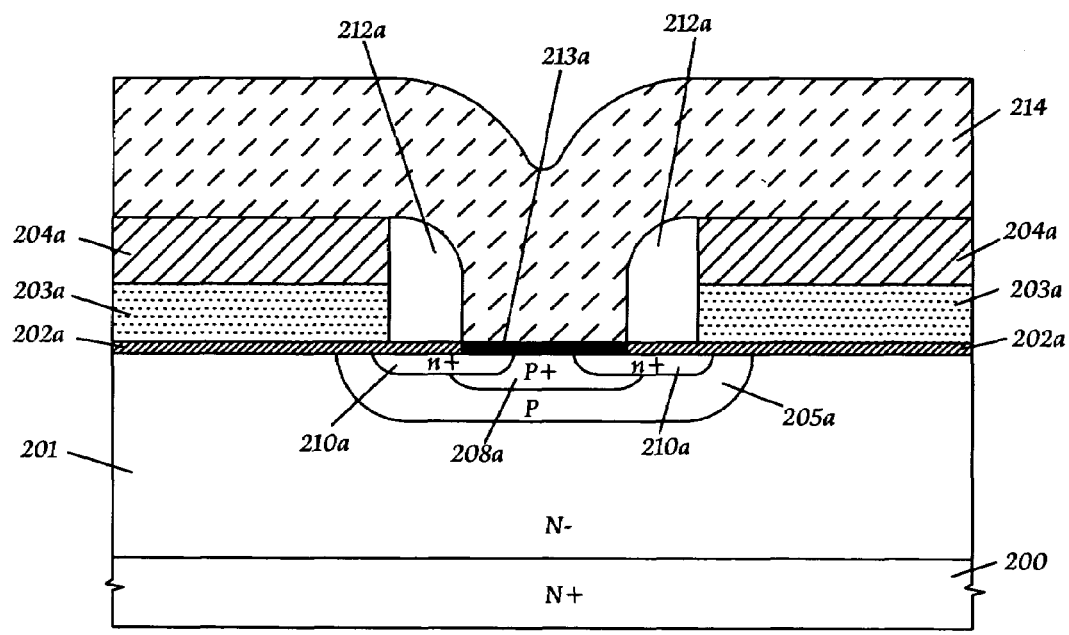

FIG. 2H shows that a metal silicide layer 213a is formed on the n+ source diffusion ring 210a surrounded by the second sidewall dielectric spacer 212a and the $p^+$ diffusion region 208a surrounded by the $n^+$ source diffusion ring 210a through the self-aligned source contact window in each of the plurality of source regions (SR) using a well-known self-aligned silicidation process; and subsequently, a metal layer 214 is formed over the metal silicide layer 213a and the second sidewall dielectric spacer 212a in each of the plurality of source regions (SR) and on the patterned oxide layer 204a. The metal layer 214 may comprise a silver (Ag), aluminum (Al) or gold (Au) layer on a barrier metal layer and the barrier metal layer may comprise a refractory metal layer or a refractory metal nitride layer. The metal silicide layer 213a comprises a refractory metal silicide layer, such as titanium disilicide ($TiSi_2$), nickel disilicide ($NiSi_2$), cobalt disilicide ($CoSi_2$), molybdenum disilicide ($MoSi_2$), tantalum disilicide ($TaSi_2$), platinum disilicide ($PtSi_2$), palladium disilicide ($PaSi_2$) or tungsten disilicide ($WSi_2$) and so forth.

From FIG. 2H, it is clearly seen that only one masking photoresist step is required to form the first-type self-aligned source structure of the present invention; the $n^+$ source diffusion ring 210a and the $p^+$ diffusion region 208a are formed in a self-aligned manner to be heavily doped, uniform current flow of a planar DMOS power transistor cell is expected; the source contact resistance is expected to be smaller due to higher surface doping concentrations ($10^{20}/cm^3$) in both the $n^+$ source diffusion ring 210a and the $p^+$ diffusion region 208a, area of the source region (SR) can be easily scaled down further; and a portion of the $p^+$ diffusion region 208a is formed under the $n^+$ source diffusion ring 210a, the parasitic base resistance of the parasitic npn bipolar transistor is much reduced, and the ruggedness of the planar DMOS power transistor is therefore improved.

Figure 3A:
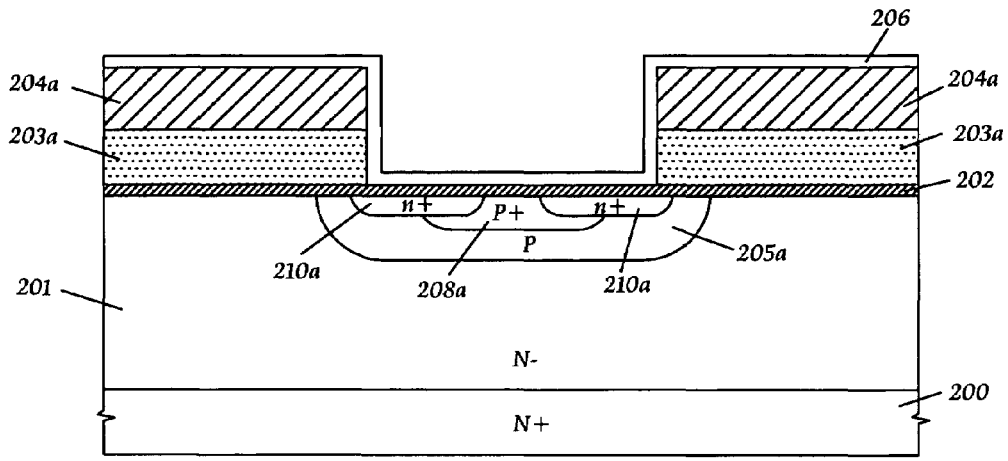
FIG. 3A through FIG. 3D show process steps after FIG. 2E and their schematic cross-sectional views of fabricating a second-type self-aligned source structure of a planar DMOS power transistor of the present invention.
Figure 3B:
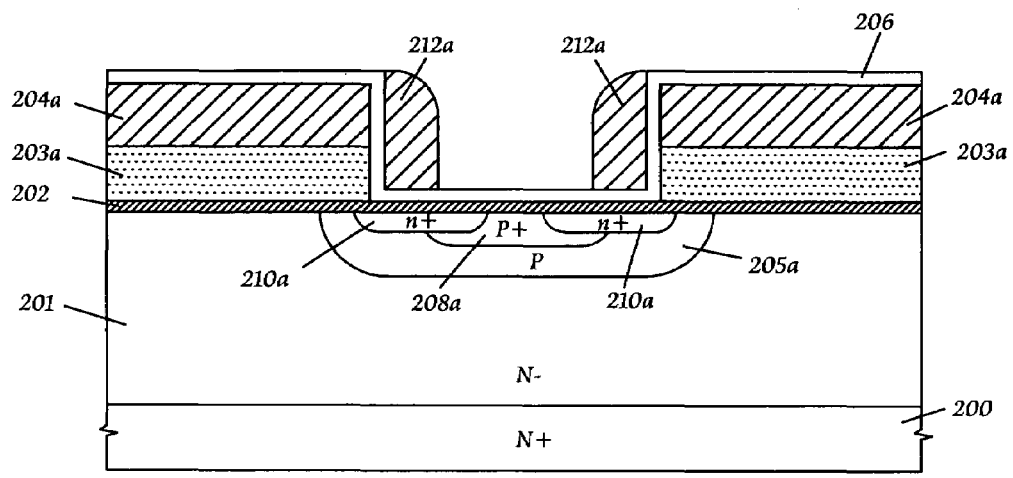
Figure 3C:
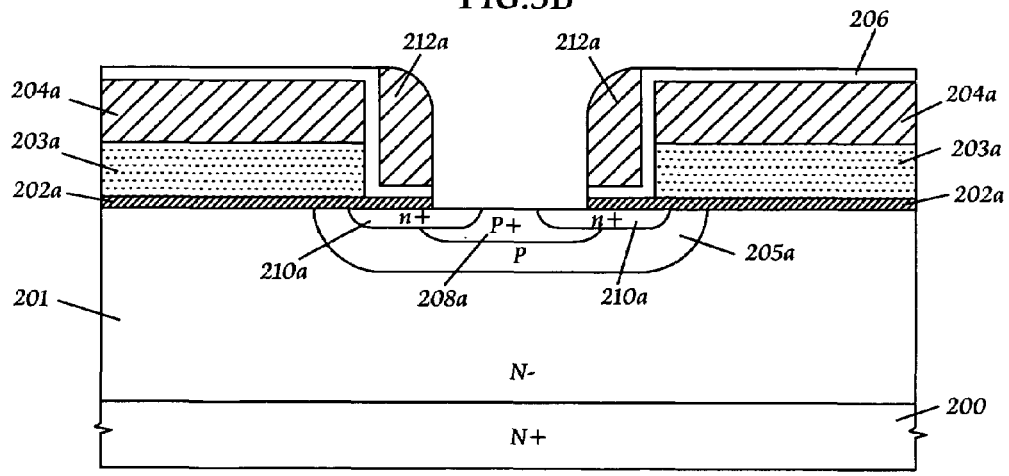

Referring now to FIG. 3A through FIG. 3C, there are shown process steps after FIG. 2E and their schematic cross-sectional views of fabricating a second-type self-aligned source structure of the present invention.

FIG. 3A shows that the masking layer 209a in FIG. 2E is stripped by using wet chemicals or plasma ashing. A drive-in process is then performed to form an $n^+$ source diffusion ring 210a in each of the plurality of source regions (SR).

FIG. 3B shows that a second sidewall dielectric spacer 212a is formed over a sidewall of the silicon nitride layer 206 and on a side portion of the silicon nitride layer 206 in each of the plurality of source regions (SR). The second sidewall dielectric spacer 212a is preferably made of silicon dioxide as deposited by LPCVD and is formed by first depositing a silicon dioxide layer 212 (not shown) over the silicon nitride layer 206 and then etching back a thickness of the deposited silicon dioxide layer 212. It should be noted that the silicon dioxide layer 212 can be replaced by a doped oxide layer such as a P-glass layer or a BP-glass layer as deposited by LPCVD or high-density plasma (HDP)CVD.

FIG. 3C shows that the silicon nitride layer 206 outside of the second sidewall dielectric spacer 212a is removed by anisotropic dry etching; and subsequently, the gate oxide layer 202 surrounded by the second sidewall dielectric spacer 212a is removed by anisotropic dry etching or wet etching.

Figure 3D:
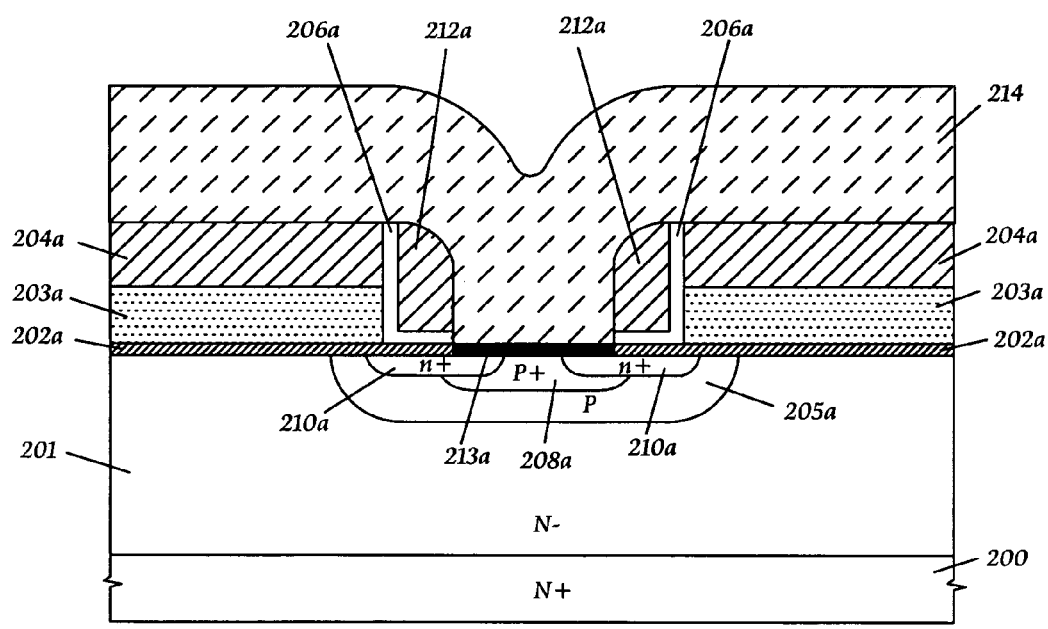

FIG. 3D shows that a metal silicide layer 213a is formed on the n+ source diffusion ring 210a surrounded by the second sidewall dielectric spacer 212a and the p$^+$ diffusion region 208a surrounded by the n$^+$ source diffusion ring 210a by using the well-known self-aligned silicidation process; and subsequently, a metal layer 214 as described in FIG. 2H is formed on the metal silicide layer 213a, the second sidewall dielectric spacer 212a and a portion of the patterned silicon nitride layer 206a in each of the plurality of source regions (SR) and also on the patterned oxide layer 204a outside of the plurality of source regions (SR).

From FIG. 3D, it is clearly seen that FIG. 3D is quite similar to FIG. 2H except that the second sidewall dielectric spacer 212a in FIG. 3D is lined with a patterned silicon nitride layer 206a. Therefore, the advantages and features of the second-type self-aligned source structure are expected to be the same as those described for the first-type self-aligned source structure.

It should be noted that FIG. 2A through FIG. 2H and FIG. 3A through FIG. 3D are mainly used to disclose the methods of fabricating the self-aligned source structures for planar n-channel DMOS power transistor, the self-aligned source structures for planar p-channel DMOS power transistor can be easily obtained by changing the doping type in the n$^-$/n$^+$ epitaxial silicon substrate 201/200, the n$^+$ source diffusion ring 210a, the p-body diffusion region 205a and the p$^+$ diffusion region 208a, as shown in FIG. 2H and FIG. 3D. Similarly, the self-aligned source structures of the present invention can also be applied to fabricate an insulated-gate bipolar transistor (IGBT) and a MOS-controlled Thyristor (MCT).

Accordingly, the advantages and features of the self-aligned source structure of the present invention can be summarized as follows:

(a) The self-aligned source structure of the present invention is fabricated in a fully self-aligned manner by using only one masking photoresist step.

(b) The self-aligned source structure of the present invention offers a heavily-doped n$^+$ diffusion ring and a heavily-doped p$^+$ diffusion region to reduce source contact resistance by using fully self-aligned techniques.

(c) The self-aligned source structure of the present invention offers an extended p$^+$ diffusion region under a portion of the heavily-doped n+ diffusion ring to reduce base resistance of parasitic npn bipolar transistor in order to improve ruggedness of a planar DMOS power transistor, an insulated-gate bipolar transistor and a MOS controlled thyristor.

(d) The self-aligned source structure of the present invention can be scaled to have a minimized surface area without considering misalignments due to critical masking photoresist steps.

While the present invention has been particularly shown and described with a reference to the present examples and embodiments as considered as illustrative and not restrictive. Moreover, the present invention is not to be limited to the details given herein, it will be understood by those skilled in the art that various changes in forms and details may be made without departure from the true spirit and scope of the present invention.

What is claimed is:

1. A self-aligned source structure, comprising:
a semiconductor substrate, wherein the semiconductor substrate comprises a lightly-doped epitaxial silicon layer of a first conductivity type being formed on a heavily-doped silicon substrate of the first conductivity type;
a body diffusion region of a second conductivity type being formed in a surface portion of the lightly-doped epitaxial silicon layer through a patterned window surrounded by a patterned oxide layer on a patterned polycrystalline-silicon gate layer, wherein the patterned polycrystalline-silicon gate layer is formed on a gate oxide layer;
a heavily-doped diffusion region of the second conductivity type being formed in a surface portion of the body diffusion region through a first self-aligned implantation window surrounded by a first sidewall dielectric spacer, wherein the first sidewall dielectric spacer is formed over a sidewall of a silicon nitride layer and on a side portion of the silicon nitride layer in the patterned window;
a heavily-doped source diffusion ring of the first conductivity type being formed in a surface portion of the body diffusion region and on an extended portion of the heavily-doped diffusion region through a second self-aligned implantation window formed between the sidewall of the silicon nitride layer and a masking layer on the silicon nitride layer surrounded by the first sidewall dielectric spacer; and
a self-aligned contact window being formed by the heavily-doped source diffusion ring surrounded by a second sidewall dielectric spacer and the heavily-doped diffusion region surrounded by the heavily-doped source diffusion ring.

2. The self-aligned source structure according to claim 1, wherein the silicon nitride layer being deposited by low-pressure chemical vapor deposition (LPCVD) is formed over the patterned oxide layer on the patterned polycrystalline-silicon gate layer and on a thermal silicon dioxide layer in the patterned window.

3. The self-aligned source structure according to claim 1, wherein the masking layer comprises a photoresist layer, a polyimide layer or a polycrystalline-silicon layer.

4. The self-aligned source structure according to claim 1, wherein the first sidewall dielectric spacer is made of silicon dioxide as deposited by LPCVD and is removed after forming the masking layer to form the second self-aligned implantation window.

5. The self-aligned source structure according to claim 1, wherein the second sidewall dielectric spacer is made of silicon nitride or silicon dioxide as deposited by LPCVD or doped silicon dioxide as deposited by LPCVD or high-density plasma (HDP) CVD and is formed over a sidewall formed by the patterned oxide layer on the patterned polycrystalline-silicon gate layer and on a side portion of a thermal silicon dioxide layer in the patterned window.

6. The self-aligned source structure according to claim 1, wherein the second sidewall dielectric spacer is made of silicon dioxide or silicon nitride as deposited by LPCVD or doped silicon dioxide as deposited by LPCVD or high-density plasma (HDP) CVD and is formed over a sidewall of the silicon nitride layer and on a side portion of the silicon nitride layer in the patterned window.

7. The self-aligned source structure according to claim 1, wherein a refractory metal silicide layer is formed on the self-aligned contact window by using a self-aligned silicidation process.

8. The self-aligned source structure according to claim 1, wherein the heavily-doped silicon substrate of the first conductivity type is formed on a heavily-doped silicon substrate of the second conductivity type.

9. A self-aligned source structure, comprising:
a semiconductor substrate, wherein the semiconductor substrate comprises a lightly-doped epitaxial silicon layer of a first conductivity type being formed on a heavily-doped silicon substrate of the first conductivity type;
a body diffusion region of a second conductivity type being formed in a surface portion of the lightly-doped epitaxial silicon layer through a patterned window surrounded by a patterned oxide layer on a patterned polycrystalline-silicon gate layer, wherein the patterned polycrystalline-silicon gate layer is formed on a gate oxide layer;
a heavily-doped diffusion region of the second conductivity type being formed in a surface portion of the body diffusion region through a first self-aligned implantation window surrounded by a first sidewall dielectric layer being formed over a sidewall of a silicon nitride layer and on a side portion of the silicon nitride layer in the patterned window, wherein the silicon nitride layer is formed over the patterned oxide layer on the patterned polycrystalline-silicon gate layer and on a dielectric layer in the patterned window;
a heavily-doped source diffusion ring of the first conductivity type being formed in a surface portion of the body diffusion region and on an extended portion of the heavily-doped diffusion region of the second conductivity type through a second self-aligned implantation window formed between a sidewall of the silicon nitride layer and a masking layer on the silicon nitride layer surrounded by the first sidewall dielectric spacer, wherein the second self-aligned implantation window is formed by removing the first sidewall dielectric spacer after forming the masking layer;
a self-aligned source contact window being formed by the heavily-doped source diffusion ring surrounded by a second sidewall dielectric spacer and the heavily-doped diffusion region of the second conductivity type surrounded by the heavily-doped source diffusion ring, wherein the second sidewall dielectric spacer is formed over a sidewall of the patterned oxide layer on the patterned polycrystalline-silicon layer and on a side portion of a thermal silicon dioxide layer formed in the patterned window;
a refractory metal silicide layer being formed on the self-aligned source contact window by using a self-aligned silicidation process; and
a metal layer being formed over the refractory metal silicide layer and the second sidewall dielectric spacer in the patterned window and on the patterned oxide layer outside of the patterned window.

10. The self-aligned source structure according to claim 9, wherein the body diffusion region is formed in a self-aligned manner by implanting a moderate dose of doping impurities across a gate oxide layer in the patterned window into a surface portion of the semiconductor substrate.

11. The self-aligned source structure according to claim 9, wherein the body diffusion region is formed in a self-aligned manner by a conventional thermal diffusion process through an exposed semiconductor substrate in the patterned window.

12. The self-aligned source structure according to claim 9, wherein the first sidewall dielectric spacer is made of silicon dioxide as deposited by LPCVD or doped oxide as deposited by LPCVD, CVD or HDPCVD.

13. The self-aligned source structure according to claim 9, wherein the masking layer comprises an organic polymer or polycrystalline-silicon layer being formed by spinning or depositing a thick masking film over a formed structure surface and then etching back the thick masking film to a predetermined thickness.

14. The self-aligned source structure according to claim 9, wherein the second sidewall dielectric spacer is made of silicon nitride or silicon dioxide as deposited by LPCVD or doped oxide as deposited by LPCVD, CVD or HDPCVD.

15. The self-aligned source structure according to claim 9, wherein the dielectric layer comprises a gate oxide layer remained in the patterned window or a thermal silicon dioxide layer regrown in the patterned window.

16. A self-aligned source structure, comprising:
a semiconductor substrate, wherein the semiconductor substrate comprises a lightly-doped epitaxial silicon layer of a first conductivity type being formed on a heavily-doped silicon substrate of the first conductivity type;
a body diffusion region of a second conductivity type being formed in a surface portion of the lightly-doped epitaxial silicon layer through a patterned window surrounded by a patterned oxide layer on a patterned polycrystalline-silicon gate layer, wherein the patterned polycrystalline-silicon gate layer is formed on a gate oxide layer;
a heavily-doped diffusion region of the second conductivity type being formed in a surface portion of the body diffusion region through a first self-aligned implantation window surrounded by a first sidewall dielectric spacer being formed over a sidewall of a silicon nitride layer and on a side portion of the silicon nitride layer in the patterned window, wherein the silicon nitride layer is formed over the patterned oxide layer on the patterned polycrystalline-silicon gate layer and on an oxide layer in the patterned window;
a heavily-doped source diffusion ring of the first conductivity type being formed in a surface portion of the body diffusion region and on an extended portion of the heavily-doped diffusion region of the second conductivity type through a second self-aligned implantation window being formed between a sidewall of the silicon nitride layer and a masking layer on the silicon nitride layer surrounded by the first sidewall dielectric spacer, wherein the second self-aligned implantation window is formed by removing the first sidewall dielectric spacer after forming the masking layer;
a self-aligned source contact window being formed on the heavily-doped source diffusion ring surrounded by a second sidewall dielectric spacer and the heavily-doped diffusion region of the second conductivity type surrounded by the heavily-doped source diffusion ring, wherein the second sidewall dielectric spacer is formed over a sidewall of the silicon nitride layer and on a side portion of the silicon nitride layer;
a refractory metal silicide layer being formed on the self-aligned source contact window by using a self-aligned silicidation process; and a metal layer being formed over the refractory metal silicide layer, the second sidewall dielectric spacer and a portion of the silicon nitride layer in the patterned window and on the patterned oxide layer outside of the patterned window.

17. The self-aligned source structure according to claim 16, wherein the masking layer comprises a photoresist layer, a polyimide layer or a polycrystalline-silicon layer being formed by spinning or depositing a thick masking film over a formed structure surface and then etching back the thick masking film to a predetermined thickness.

18. The self-aligned source structure according to claim 16, wherein the first sidewall dielectric spacer is made of silicon dioxide deposited by LPCVD or doped oxide deposited by LPCVD, CVD or HDPCVD.

19. The self-aligned source structure according to claim 16, wherein the second sidewall dielectric spacer is made of silicon nitride or silicon dioxide as deposited by LPCVD or doped oxide as deposited by LPCVD, CVD or HDPCVD.

20. The self-aligned source structure according to claim 16, wherein a thin polyoxide layer is formed over a sidewall of the patterned polycrystalline-silicon gate layer and the oxide layer is the gate oxide layer or a thermal silicon dioxide layer.

* * * * *